United States Patent [19]
Yuen

[11] 4,195,358
[45] Mar. 25, 1980

[54] DECODER FOR A PROM

[75] Inventor: Raymond C. Yuen, San Diego, Calif.

[73] Assignee: Burroughs Corporation, Detroit, Mich.

[21] Appl. No.: 973,175

[22] Filed: Dec. 26, 1978

[51] Int. Cl.² .................. G11C 8/00; G11C 17/00
[52] U.S. Cl. ........................... 365/230; 307/215; 307/238; 365/96
[58] Field of Search ............ 365/94, 96, 104, 189, 365/230; 307/215, 238, DIG. 5

[56] References Cited

U.S. PATENT DOCUMENTS

| 3,259,761 | 7/1966 | Narud et al. | 307/215 |
| 3,535,546 | 10/1970 | Davis | 307/215 |
| 3,787,737 | 1/1974 | Mukai | 307/215 |

FOREIGN PATENT DOCUMENTS 2505274  8/1976  Fed. Rep. of Germany ............ 365/96

Primary Examiner—Stuart N. Hecker
Attorney, Agent, or Firm—Joseph R. Dwyer; Kevin R. Peterson

[57] ABSTRACT

Circuitry for programming a read-only memory comprising a plurality of decoding transistors of low current density for selecting the row of the programmable matrix and which function to operate a high current density control transistor through a large voltage swing for controlling an output transistor of the circuitry connected directly to the array. The decoding transistors are operable through a CML voltage swing in a non-saturated mode with minimum current to operate the control transistor of high current density from cut-off to saturation to turn the output transistor ON or OFF, which in turn directs the high voltage from a high voltage source to the programmable memory.

10 Claims, 4 Drawing Figures

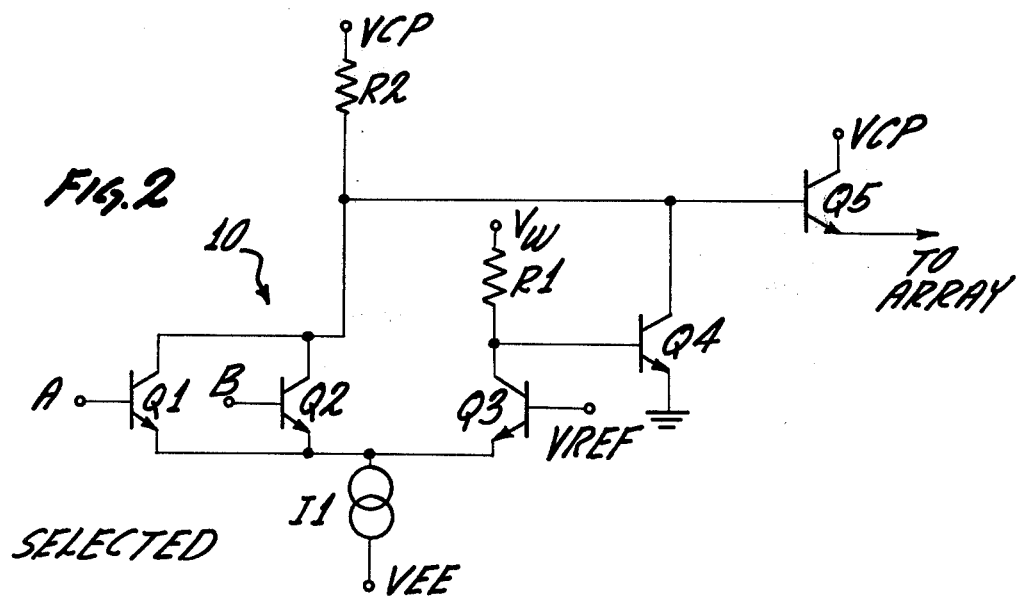
Fig. 2
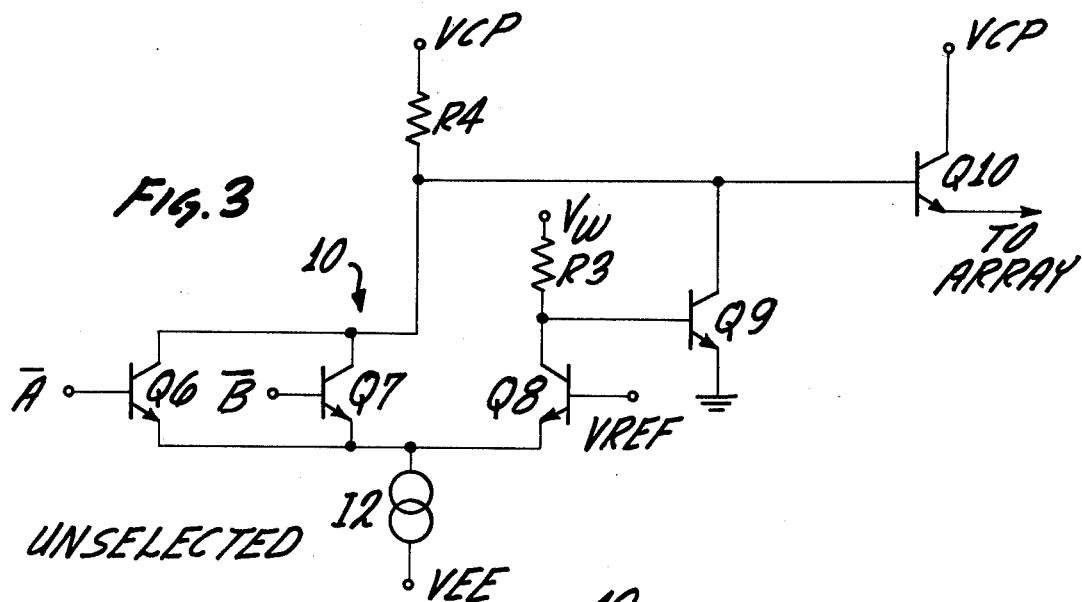
Fig. 3
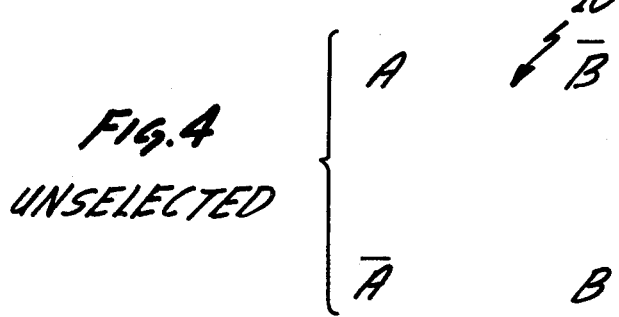
Fig. 4 UNSELECTED

DECODER FOR A PROM

BACKGROUND OF THE INVENTION

This invention relates to circuitry for programming a programmable read-only memory (PROM) and more particularly to a combined programming circuitry for programming such a memory and for reading the information contained in said memory.

Matrix arrays in which information is permanently located are known in the art. The matrix array, as a single integrated circuit, comprises rows and columns of parallel electrical conductors formed with the devices connecting the intersections or cross-over points of the rows and columns. After the manufacture of the matrix, the connecting devices at predetermined intersections of the rows and columns are permanently altered by the application of a current pulse across the connecting device to render the connection between intersection inoperative thus forming a read-only memory (ROM). The connecting device is either opened or closed depending on how the PROM is programmed.

There are a number of patents such as the U. S. Pat. to Rizzi et al No.'s 3,742,592, 3,848,238, and 3,733,690 and the U.S. Pat. to Castrucci No. 3,641,516 showing matrix arrays with connecting devices at the intersection of the rows and columns and showing methods of applying suitable current to the selected conductors to program the memory.

This invention is directed to circuitry for programming the memory matrix in which current for selecting a memory row is handled by a minimum number of active components and thus the remainder of the circuitry can be smaller with less propagation delay and the circuit is operated with less power dissipation.

The prior art programming circuitry is arranged such that the high current required for programming the memory is directed through all of the transistors of the circuitry, thus, the transistors have high current densities which reduces the speed of operation of the circuitry which is a factor of the current density and also require more power to operate. Additionally, the prior art decoder, if it is to be used also as a read circuitry after the programming of the memory, requires an additional current source, or alternatively two separate circuits; one for programming the memory and one for reading the memory.

Accordingly it is an object of this invention to increase the speed of the programming circuitry over the prior art circuitry and to direct the high current through a minimum number of components and thus operate the circuitry with smaller components, at higher speeds, and with less power consumption.

SUMMARY OF THE INVENTION

The circuitry of the invention which accomplishes the foregoing objects comprises a plurality of decoding transistors of low current density for selecting the row of the programmable matrix and which function to operate a high current density control transistor through a large voltage swing for controlling the output transistor of the circuitry connected directly to the array. The decoding transistors are operable through a CML voltage swing in a non-saturated mode with minimum current to operate the control transistor of high current density from cut-off to saturation to turn the output transistor ON or OFF which in turn directs the high voltage from a high voltage source to the programmable memory.

BRIEF DESCRIPTION OF THE DRAWINGS

FIGS. 2 and 3 show two of four identical circuits of the X decoder of FIG. 1 for programming the memory with FIG. 2 being arbitrarily the selected circuitry for illustrating the application of high voltage to the memory; and FIG. 4 is representations of the input nodes for two more circuits of the four circuits thus illustrating essentially four identical circuits of a plurality of circuits in an X decoder.

BRIEF DESCRIPTION OF THE PREFERRED EMBODIMENT

Figure 1:
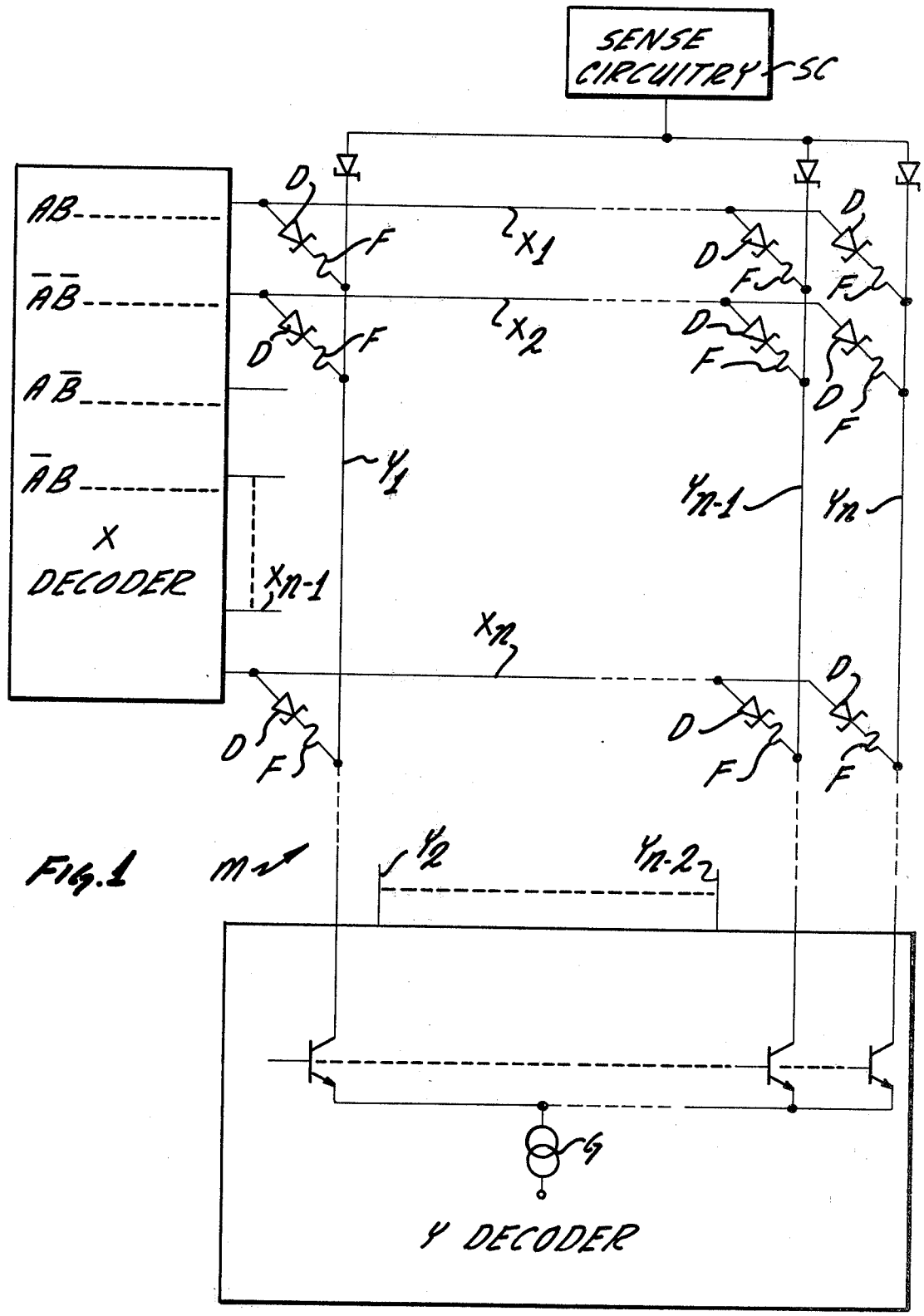
FIG. 1 is a schematic illustration of a portion of a PROM.

In FIG. 1, there is shown a schematic illustration of a matrix array M formed of a plurality of substantially parallel electrically conducting rows $X_1$–$X_n$ and a second plurality of spaced apart parallel electrically conducting columns $Y_1$–$Y_n$ which are disposed normal to the rows but out of contact therewith. The rows and columns are disposed in separate levels with connecting devices, shown as Schottky diodes D and fuses F located at the intersections, or cross-over points, of the columns and rows. Conventionally, the connecting device between the selected row and column is rendered inoperative, i.e., opened or closed, depending on how the PROM is programmed, to represent one of the two logic states as binary information to be stored in memory. In the embodiment illustrated, the selected fuse D is blown, i.e., the connecting device is opened, to disconnect the selected row and column. Also illustrated in FIG. 1 is an X decoder and a Y decoder by which the selected row and column may be activated or sensed to read the logic state, or information stored in memory, which is sensed in a sense circuit SC and, in the embodiment disclosed, these decoders are also used to program the PROM.

Turning now to FIGS. 2–4 of which FIGS. 2 and 3 represent identical circuits connected to the first two rows of the matrix array M while FIG. 4 shows the input nodes to circuitry, identical to the circuitry of FIGS. 2 and 4, but represented only as nodes for simplicity of disclosure.

Taking first FIG. 2, the decoder circuitry 10 comprises input decoding transistors Q1 and Q2 of the NPN type with there respective bases connected to two input nodes A and B. Transistors Q1 and Q2 have their emitters connected to a current source I1 and voltage source VEE. The emitters of transistors Q1 and Q2 are also connected in common to the emitter of NPN transistor Q3 to form a logic gate. The base of transistor Q3 is connected to a reference voltage source VREF selected to be midway between the voltage swings applied to the input nodes A and B and to the bases of the transistors Q1 and Q2. The collector of transistor Q3 is connected to a voltage source VW through resistor R1 and is also connected to the base of NPN control transistor Q4. The emitter of control transistor Q4 is connected to ground and its collector is connected in common to the collectors of transistors Q1 and Q2 and to a second voltage source VCP through resistor R2 and in common to the base of output NPN transistor Q5. Output transistor Q5 is connected to the first row of the array and its collector is connected to the programming voltage source VCP. The voltage source VCP is several times larger than the voltage source VW and the current density of transistor Q4 is larger than the current density of the other transistors to handle the larger current flowing therethrough to ground.

The circuitry of FIG. 3 is identical to the circuitry of FIG. 2 and therefore does not require explanation. The resistors and transistors are identical to the corresponding resistors and transistors in FIG. 2 except that different reference numerals are utilized; that is to say, for example, transistors Q6 and Q7 are identical to transistors Q1 and Q2, etc. For the sake of disclosure the circuitry of FIGS. 3 and 4 represent unselected rows whereas the circuitry of FIG. 2 is the circuitry selected for destroying or blowing the fuse D between the first row and column of the array. To do this selection, the voltage applied to both nodes of selected circuitry must be LOW while a high voltage must be applied to either or both nodes of the unselected circuitry.

As will be clear from the following description, by reason of the current flow in the circuit, decoding or gating transistors Q1-Q3 of FIG. 2, and Q6-Q8 of FIG. 3, arranged to operate as a CML type gates are of low current density, as compared to the control transistors Q4 and Q9 and output transistors Q5 and Q10, since the latter are required to handle the current many times larger than the current flow through the decoding transistors.

Taking first the condition of the unselected row circuitry and utilizing FIG. 3 as an example, the purpose is to have the base of transistor Q10 at or near ground voltage (0.0 volts or nearly so) so that transistor Q10 is OFF. To do this either $\bar{A}$ or $\bar{B}$, or both, must be High so that either input transistor Q6 or Q7 is ON or both transistors Q6 and Q7 are ON. Under this condition (which corresponds to NOR gate truth table values), the voltage applied to the bases or either or both the input transistors is higher than the reference voltage VREF applied to the base of transistor Q8 and thus transistor Q8 is OFF. With transistor Q8 OFF, the collector of transistor Q8 and the voltage applied to base of transistor Q9 is at the voltage level of voltage source VW since no current is flowing through resistor R3. The voltage VW is selected such that the base emitter voltage of transistor Q9 is sufficiently HIGH to saturate transistor Q9, and in this mode, the collector of transistor Q9 is at ground, or nearly so, depending on the collector resistance of transistor Q9. With the collector of transistor Q9 at ground, or nearly so, high current flows from voltage source VCP through resistor R4 and through transistor Q9 to ground lowering the voltage level applied to the base of transistor Q10 and holding transistor Q10 OFF.

Considering now the circuitry condition for a selected row and referring to FIG. 2, the input levels applied to nodes A and B and to the bases of transistors of Q1 and Q2 are low while one or both of the input transistors in circuitry for the other three rows are kept HIGH. With the bases of input transistors Q1 and Q2 LOW, the reference voltage VREF is higher than the voltagee at A and B and therefore transistor Q3 is ON. With transistor Q3 ON, current from voltage source VW flows through transistor Q3 and resistor R1, dropping the voltage at the collector of transistor Q3 and the base of transistor Q4 to a low lever, turning transistor Q4 OFF. With transistor Q4 OFF, no current flows through resistor R2 so that the base of output transistor Q5 is at a voltage level of voltage source VCP to the array.

Therefore, the differential voltage on output transistors Q5 and Q10 between a selected and unselected circuit is the difference in value between the voltage of voltage source VCP and ground. Thus, it becomes apparent that the current densities of transistors Q1, Q2 and Q3, and their counterpart transistors Q6, Q7 and Q8, can be significantly lower than the current densities of transistors Q4 and Q9 since the current that flows therethrough is significantly lower. Thus, it is also apparent that the high current is flowing through the least number of components and that the speed of the circuitry is higher since only low current density transistors are used as decoding transistors.

In a partical embodiment of an X decoder constructed according to the teachings of the invention, resistors R1-4 each equal 800 ohms, voltage source VW equals +1.6 volts, reference voltage source VREF equals −1.8 volts, voltage source VCP equals +12.0 volts, current sources I1 and I2 each equal 1.5 milliamps, the current through transistor Q4 and Q9 when ON is 13.0 milliamps and the current through output transistors Q5 and Q10 is 50 milliamps, and as to the input sinals, HIGH equals −1.6 volts and LOW equals −2.0 volts; a voltage swing of 400 millivolts whereas the voltage swing on the control and output transistors is 12 volts.

The foregoing resistance, voltage and current values pertaining to the circuit are exemplary only and will vary according to the needs of those skilled in the art when practicing the inventive concept herein.

What is claimed is:

1. A programming circuit for a PROM comprising:
   a plurality of gain elements each having a given current density and each having a base, emitter and collector, the emitters of said gain elements being connected in common and to a current source,
   the collector of one of said gain elements being connected to a first voltage source and the collectors of the other of said gain elements being connected in common and to a second voltage source,
   the base of said one gain element being connected to a threshold voltage while the bases of the other gain elements forming inputs to said circuit for receiving signals from another source, said threshold voltage being selected to be substantially midway between the voltage swings on said inputs,
   a control gain element having a collector, emitter, and base, the collector of said control gain element being connected to said second voltage source while its emitter is connected to a reference voltage and its base is connected to the collector of said one gain element, and
   an output gain element whose base is connected to said second voltage source and to the collector of said control gain element while its emitter is connected to the PROM whereby when said threshold voltage is higher than the voltages applied to said inputs, high voltage is applied to said PROM, and when the threshold voltage is lower than said input, no voltage is applied to said PROM.

2. The circuit as claimed in claim 1 wherein the current density of the control and output gain elements is higher than the given current density of said plurality of gain elements.

3. The circuit as claimed in claim 2 wherein said reference voltage is ground.

4. The circuit as claimed in claim 3 wherein the voltage of said second voltage source is higher than the voltage of said first voltage source.

5. The circuit as claimed in claim 1 wherein said gain elements are NPN transistors.

6. The circuit as claimed in claim 5 wherein said NPN transistors forming said plurality of gain elements are operated in a current mode as switching transistors having an ON and OFF states wherein the NPN transistor forming the control gain element is driven to saturation when said NPN transistor forming said one gain element is OFF.

7. A circuit for programming a PROM comprising
a gate whose output corresponds to a NOR truth table,
a control gain element connected to the output of said gate and connected between a high voltage source and a reference voltage source,
an additional gain element connected to said high voltage source and to the PROM and responsive to the condition of said control gain element.

8. The circuit as claimed in claim 7 wherein said gate operates in current mode logic mode and said control gain element operates in a saturation mode in response to the output of said gate.

9. The circuit as claimed in claim 8 wherein said control gain element and said additional gain elements are NPN transistors.

10. The circuit as claimed in claim 9 wherein the gate comprises NPN transistors.

* * * * *